(12) United States Patent
Wu et al.

(10) Patent No.: US 12,033,895 B2
(45) Date of Patent: Jul. 9, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Chung-Shu Wu, Taoyuan (TW); Tze-Chung Lin, Hsinchu (TW); Shih-Chiang Chen, Taichung (TW); Hsiu-Hao Tsao, Taichung (TW); Chun-Hung Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 380 days.

(21) Appl. No.: 17/461,526

(22) Filed: Aug. 30, 2021

(65) Prior Publication Data
US 2023/0080290 A1    Mar. 16, 2023

(51) Int. Cl.
*H01L 21/8234* (2006.01)
*H01L 29/06* (2006.01)
*H01L 29/423* (2006.01)
*H01L 29/66* (2006.01)
*H01L 29/786* (2006.01)

(52) U.S. Cl.
CPC ......... *H01L 21/823412* (2013.01); *H01L 21/823418* (2013.01); *H01L 29/0665* (2013.01); *H01L 29/42392* (2013.01); *H01L 29/6653* (2013.01); *H01L 29/66553* (2013.01); *H01L 29/78696* (2013.01)

(58) Field of Classification Search
CPC ..... H01L 21/823412; H01L 21/823418; H01L 29/0665; H01L 29/42392; H01L 29/6653; H01L 29/66553; H01L 29/78696; H01L 29/0673; H01L 29/775; H01L 29/66439; H01L 29/165; H01L 29/267; H01L 29/7848; H01L 29/66545; B82Y 10/00
See application file for complete search history.

(56) References Cited

U.S. PATENT DOCUMENTS

| | | | |
|---|---|---|---|
| 10,096,524 B1* | 10/2018 | Bi | H01L 29/66818 |
| 2020/0168742 A1* | 5/2020 | Wang | H01L 21/02532 |
| 2020/0411698 A1* | 12/2020 | Kim | H01L 29/66439 |

* cited by examiner

*Primary Examiner* — Karen Kusumakar
*Assistant Examiner* — Adam S Bowen
(74) *Attorney, Agent, or Firm* — FOLEY & LARDNER LLP

(57) ABSTRACT

A method of fabricating a semiconductor device is disclosed. The method includes providing a semiconductor substrate. Alternating layers of a first semiconductor layer and a second semiconductor layer are formed. The first semiconductor layer is formed of a first semiconductor material, the second semiconductor layer formed of a second semiconductor material different from the first semiconductor material. The alternating layers of the first semiconductor layer and the second semiconductor layer are patterned to form stacks of the alternating layers and to expose lateral edges of the alternating layers in the stacks. Under etch conditions, the lateral edges of the alternating layers in the stacks are exposed to etchant to selectively etch recesses in the lateral edges of the first semiconductor layer such that a size of the recesses is substantially uniform.

20 Claims, 16 Drawing Sheets

SEMICONDUCTOR DEVICES AND METHODS OF MANUFACTURING THEREOF

BACKGROUND

The semiconductor integrated circuit (IC) industry has experienced exponential growth. Technological advances in IC materials and design have produced generations of IC s where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-16 illustrate cross-sectional views cut with the channel (X-X in perspective view of FIG. 1).

FIG. 8 illustrates a magnified cross-sectional view of a portion of the device of FIG. 7 in a region showing portions of recesses formed in the first semiconductor layer in accordance with some embodiments.

DETAILED DESCRIPTION

Figure 1:
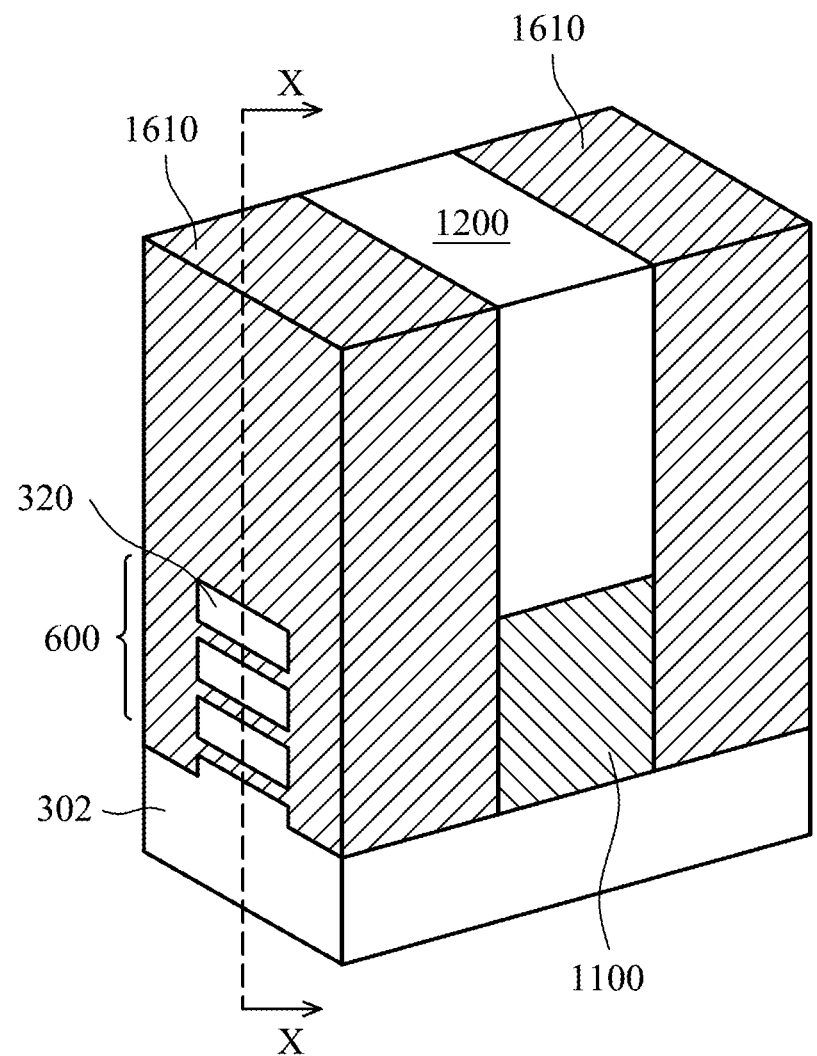
FIG. 1 illustrates a perspective view of the semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as field effect transistors are fabricated on a single wafer. Non-planar transistor device architectures, such as fin-based transistors (typically referred to as "FinFETs"), can provide increased device density and increased performance over planar transistors. Some advanced non-planar transistor device architectures, such as nanostructure transistors, for example nanosheet (or nanowire) transistors, can further increase the performance over the FinFETs. When compared to the FinFET where the channel is partially wrapped (e.g., straddled) by a gate structure, the nanostructure transistor, in general, includes a gate structure that wraps around the full perimeter of one or more nanosheets for improved control of channel current flow. For example, in a FinFET and a nanostructure transistor with similar dimensions, the nanostructure transistor can present larger driving current ($I_{on}$), smaller subthreshold leakage current ($I_{off}$), etc. Such a nanostructure transistor that has a gate structure fully wrapping around its channel is typically referred to as a gate-all-around (GAA) transistor or GAAFET.

The present disclosure provides various embodiments of a semiconductor device, which may include a nanostructure transistor. Embodiments of the present disclosure are discussed in the context of forming a non-planar transistor, such as a nanostructure transistor. In some embodiments, a semiconductor substrate is provided. Subsequently alternating layers of first semiconductor layers and second semiconductor layers are formed. The first semiconductor layers is formed of a first semiconductor material, the second semiconductor layer is formed of a second semiconductor material different from the first semiconductor material. The first semiconductor layers include a first semiconductor sub-layer and a second semiconductor sub-layer below the first semiconductor sub-layer. Next, the alternating layers of the first semiconductor layers and the second semiconductor layers are patterned to form stacks of the alternating layers and to expose lateral edges of the alternating layers in the stacks. Next, under etch conditions, the lateral edges of the alternating layers in the stacks are exposed to etchant to selectively etch recesses in the lateral edges of the first semiconductor sublayer and the second semiconductor sublayer such that a size of the recesses is substantially uniform. The etch conditions include exposing the lateral edges of the alternating layers in the stacks to a dilution gas and reaction gas under plasma-less conditions.

A nanostructure transistor formed by the above described method can advantageously control the critical dimension (CD) of the first semiconductor layer, and the subsequently formed inner spacers. Improved defect performance can be achieved due to uniform lateral thickness of the inner spacers. Further, a wider window can be achieved for metal gate CD control.

FIG. 1 illustrates a perspective view of the semiconductor device 300 according to some embodiments. The semiconductor device 300 includes stack 600 of second semiconductor layers 320 extending above the substrate 302. The active gates 1610 are formed between the second semiconductor layers 320, which act as channels between the source/drain (S/D) structures 1100. The ILD 1200 is disposed above the S/D structures 1100 and adjacent the active gates 1610. FIGS. 3-16 illustrate cross-sectional views cut along the channel (X-X in FIG. 1).

Figure 2:
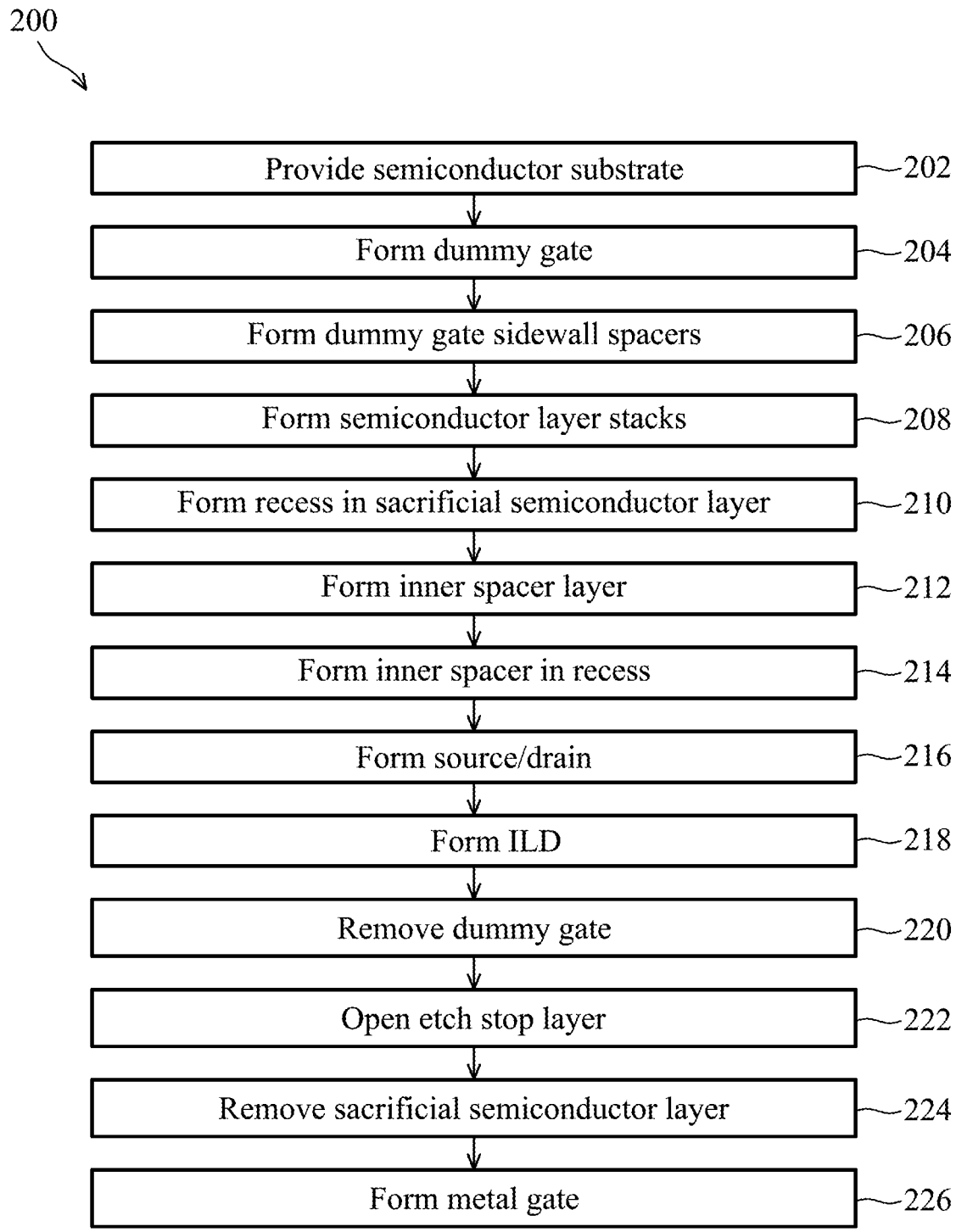
FIG. 2 illustrates a flow chart of an example method to make a semiconductor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a nanostructure transistor device such as, for example, a nanosheet transistor device, a nanowire transistor device, a vertical transistor device, gate-all-around or the like. Further, the method 200 can be used to form a nanostructure transistor device in a respective conduction type such as, for example, an n-type nanostructure transistor device or a p-type nanostructure transistor device. The term "n-type," as used herein, may be referred to as the conduction type of a transistor having electrons as its conduction carriers; and the term "p-type," as used herein, may be referred to as the conduction type of a transistor having holes as its conduction carriers.

It is noted that the method 200 is merely an example, and is not intended to limit the present disclosure. Accordingly, it is understood that additional operations may be provided before, during, and after the method 200 of FIG. 2, and that some other operations may only be briefly described herein. In various embodiments, operations of the method 200 may be associated with perspective views of an example nanostructure transistor device at various fabrication stages as shown in the various Figures.

In brief overview, the method 200 starts with operation 202 of providing a substrate overlaid by a number of first semiconductor layers and a number of second semiconductor layers. Next, the method 200 proceeds to operation 204 of forming dummy gates over the first and second semiconductor layers. Next, the method 200 proceeds to operation 206 of forming sidewall spacers on the dummy gates. Next, the method 200 proceeds to operation 208 of forming stacks of the first and second semiconductor layers. Next, the method 200 proceeds to operation 210 of forming recesses in the sides of the first semiconductor layers (sacrificial semiconductor layers) Next, the method 200 proceeds to operation 212 of forming an inner spacer layer. Next, the method 200 proceeds to operation 214 of forming inner spacers in the recesses in the sides of the first semiconductor layers. Next, the method 200 proceeds to operation 216 of forming source and drain regions. Next, the method 200 proceeds to operation 218 of forming an interlevel dielectric (ILD). Next, the method 200 proceeds to operation 220 of removing the dummy gates. Next, the method 200 proceeds to operation 222 of opening the etch stop layer. Next, the method 200 proceeds to operation 224 of removing the sacrificial layers (first semiconductor layers through the opened etch stop. Next, the method 200 proceeds to operation 226 of forming the metal gate.

Figure 3:
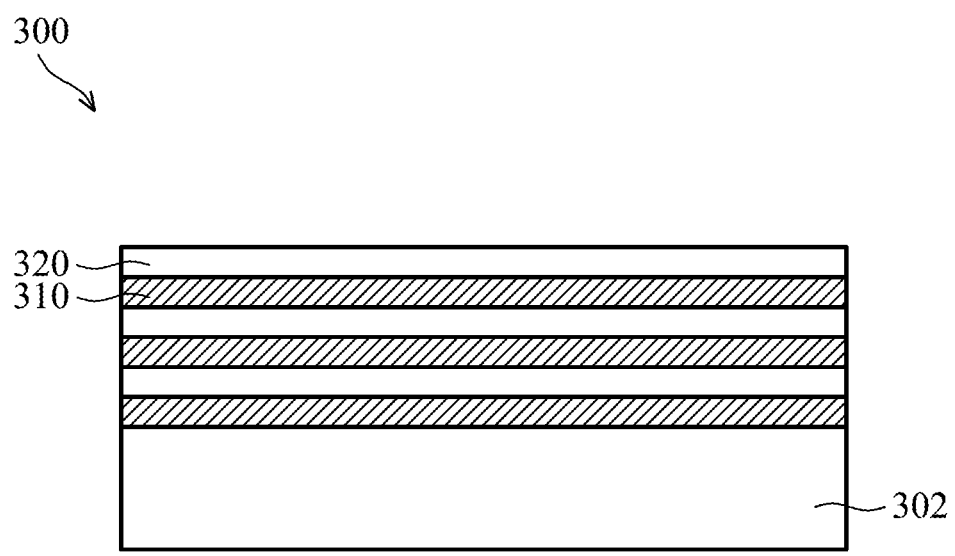
FIGS. 3-16, illustrate cross-sectional views of a semiconductor device, made by the method of FIG. 2, during various fabrication stages in accordance with some embodiments.

Corresponding to operation 202 of FIG. 2, FIG. 3 is a cross-sectional view of the nanostructure transistor device 300 including a number of first semiconductor layers 310 and a number of second semiconductor layers 320 formed on a semiconductor substrate 302 at one of the various stages of fabrication, where the first semiconductor layers 310 function as sacrificial layers, as discussed later. As shown in the illustrated example of FIG. 3, the semiconductor layers 310 and 320 are formed alternately over the semiconductor substrate 302.

The semiconductor substrate 302 includes a semiconductor material substrate, for example, silicon. Alternatively, the semiconductor substrate 302 may include other elementary semiconductor material such as, for example, germanium. The semiconductor substrate 302 may also include a compound semiconductor such as silicon carbide, gallium arsenide, indium arsenide, and indium phosphide. The semiconductor substrate 302 may include an alloy semiconductor such as silicon germanium, silicon germanium carbide, gallium arsenic phosphide, and gallium indium phosphide. In one embodiment, the semiconductor substrate 302 includes an epitaxial layer. For example, the semiconductor substrate 302 may have an epitaxial layer overlying a bulk semiconductor. Furthermore, the semiconductor substrate 302 may include a semiconductor-on-insulator (SOI) structure. For example, the semiconductor substrate 302 may include a buried oxide (BOX) layer formed by a process such as separation by implanted oxygen (SIMOX) or other suitable technique, such as wafer bonding and grinding.

The first semiconductor layers 310 and the second semiconductor layers 320 are alternatingly disposed on top of one another (e.g., along the Z direction). For example, one of the second semiconductor layers 320 is disposed over one of the first semiconductor layers 310, then another one of the first semiconductor layers 310 is disposed over the second semiconductor layer 320, so on and so forth.

The semiconductor layers may include any number of alternately disposed semiconductor layers 310 and 320. The semiconductor layers 310 and 320 may have different thicknesses. The first semiconductor layers 310 may have different thicknesses from one layer to another layer. The second semiconductor layers 320 may have different thicknesses from one layer to another layer. The thickness of each of the semiconductor layers 310 and 320 may range from a few nanometers to a few tens of nanometers. The first layer of the semiconductor layers may be thicker than other semiconductor layers 310 and 320. In an embodiment, each of the first semiconductor layers 310 has a thickness ranging from about 5 nanometers (nm) to about 20 nm, and each of the second semiconductor layers 320 has a thickness ranging from about 5 nm to about 20 nm.

The two semiconductor layers 310 and 320 have different compositions. In various embodiments, the two semiconductor layers 310 and 320 have compositions that provide for different oxidation rates and/or different etch selectivity between the layers. In an embodiment, the semiconductor layers 310 include silicon germanium ($Si_{1-x}Ge_x$), and the semiconductor layers include silicon (Si). In an embodiment, each of the second semiconductor layers 320 is silicon that may be undoped or substantially dopant-free (i.e., having an extrinsic dopant concentration from about 0 $cm^{-3}$ to about $1 \times 10^{17}$ $cm^{-3}$), where for example, no intentional doping is performed when forming the layers 320 (e.g., of silicon).

In various embodiments, the semiconductor layers 320 may be intentionally doped. For example, when the nanostructure transistor device 300 is configured in p-type (and operates in an enhancement mode), each of the semiconductor layers 320 may be silicon that is doped with a p-type dopant such as boron (B), aluminum (Al), indium (In), and gallium (Ga); and when the nanostructure transistor device 300 is configured in n-type (and operates in an enhancement mode), each of the semiconductor layers 320 may be silicon that is doped with an n-type dopant such as phosphorus (P), arsenic (As), antimony (Sb). In another example, when the nanostructure transistor device 300 is configured in n-type (and operates in a depletion mode), each of the semiconductor layers 320 may be silicon that is doped with an n-type dopant instead; and when the nanostructure transistor device 200 is configured in p-type (and operates in a depletion mode), each of the semiconductor layers 320 may be silicon that is doped with a p-type dopant instead. In some embodiments, each of the semiconductor layers 310 is $Si_{1-x}Ge_x$ that includes less than 50% (x<0.5) Ge in molar ratio. For example, Ge may comprise about 15% to 35% of the semiconductor layers of $Si_{1-x}Ge_x$ in molar ratio. Furthermore, the first semiconductor layers 310 may include different compositions among them, and the second semiconductor layers 320 may include different compositions among them.

Either of the semiconductor layers 310 and 320 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 310 and 320 may be chosen based on providing differing oxidation rates and/or etch selectivity.

The semiconductor layers 310 and 320 can be epitaxially grown from the semiconductor substrate 302. For example, each of the semiconductor layers 310 and 320 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 310 and 320 having the same crystal orientation with the semiconductor substrate 302.

Figure 4:
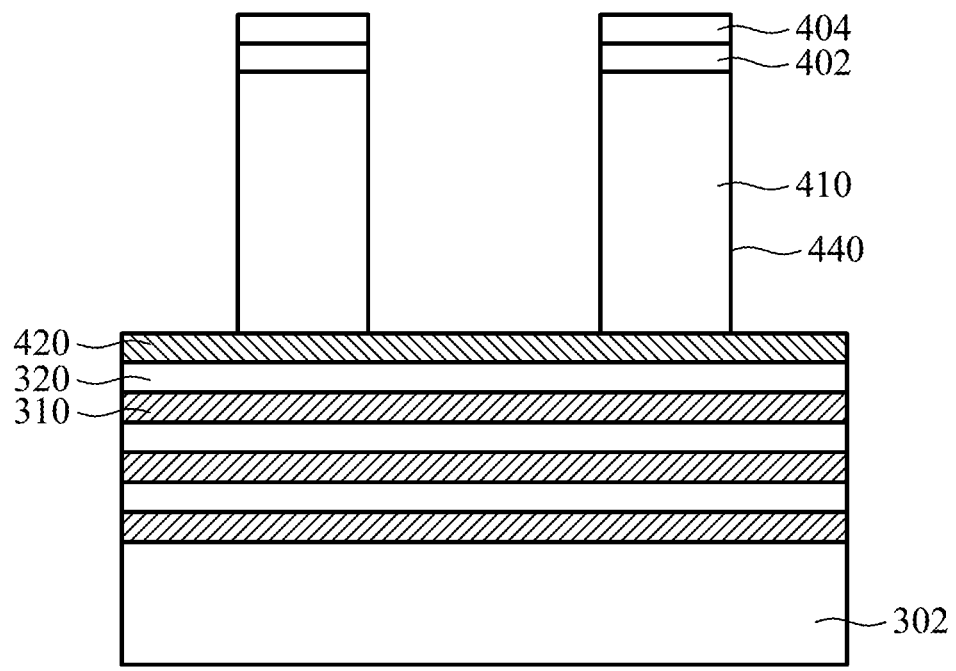

Corresponding to operation 204 of FIG. 2, FIG. 4 is a cross-sectional view of the nanostructure transistor device 300 with formed dummy gates 410. An etch stop layer 420 may be formed over the semiconductor layers 310 and 320, and dummy gates 410 formed on the etch stop layer 420. The etch stop layer 420 may include silicon oxide. The etch stop layer 420 may be formed by a deposition process, such as CVD (such as PECVD, HARP, or combinations thereof) process, ALD process, another applicable process, or a combination thereof.

Dummy gate material is formed over the semiconductor layers 310 and 320, and then photolithographically processed to form the dummy gates 410. For example, the dummy gates 410 may be formed by patterning using an etch mask, where the etch mask includes a first etch mask 404 and/or a second etch mask 402, where the first etch mask 404 may be formed on the second etch mask 402. The first etch mask 404 and the second etch mask 402 may be patterned photoresist and a hard mask, respectively. The first etch mask 404 and the second etch mask 402 may be removed at some point following forming the dummy gates 410. The dummy gate material may be formed of a semiconductor material, such as Si, for example, or a dielectric material, for example.

The dummy gates 410 may be formed by, for example, a dry etch. For example, for a dummy gate material of silicon, an etch gas of a dry etch may include at least one of $Cl_2$, HBr, $CF_4$, $CHF_3$, $CH_2F_2$, $CH_3F$, $C_4F_6$, $BCl_3$, $SF_6$, or $H_2$.

The etching of the dummy gate material may include a wet clean etch, for example. The wet clean etch may include, for example for a Si dummy gate material, a main etch chemical of at least one of HF, $F_2$, or $H_3PO_4$, an assisted etch chemical for selectivity tuning of at least one of $O_3$, $H_2SO_4$, HCl, HBr, or $NH_3$, and a solvent of at least one of DI water, alcohol or acetone.

Figure 5:
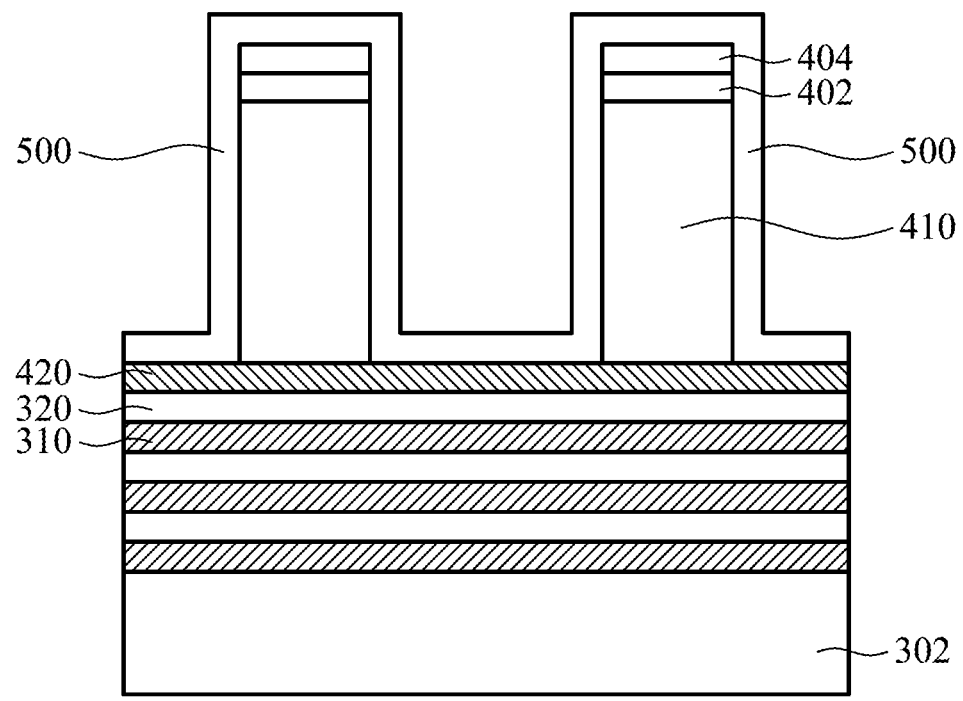

Corresponding to operation 206 of FIG. 2, FIG. 5 is a cross-sectional view of the nanostructure transistor device 300 with sidewall spacers 500. The sidewall spacers 500 are formed on sidewalls 440 of the dummy gates 410. Any suitable deposition method, such as thermal oxidation, chemical vapor deposition (CVD), physical vapor deposition (PVD), atomic layer deposition (ALD), or the like, may be used to form the sidewall spacers 500. The shapes and formation methods of the sidewall spacers 500 as illustrated and described in FIG. 5 are merely non-limiting examples, and other shapes and formation methods are possible. These and other variations are fully intended to be included within the scope of the present disclosure.

The sidewall spacer 500 may include a number of sublayers. The number of sublayers may be between 1 and 9, for example. The sub-layers may be formed of different materials, for example.

The sidewall spacer 500, and its sublayers, if any, may be Si-based materials, for example, such as at least one of SiN, SiON, SiCN, SiOCN, $SiO_2$, or SiC. Alternatively, the sidewall spacer 500 may be metal-based materials, for example, such as at least one of HfO or $Al_2O_3$. The thickness of the sublayers may be between 0.5 nm and 100 nm, for example.

Figure 6:
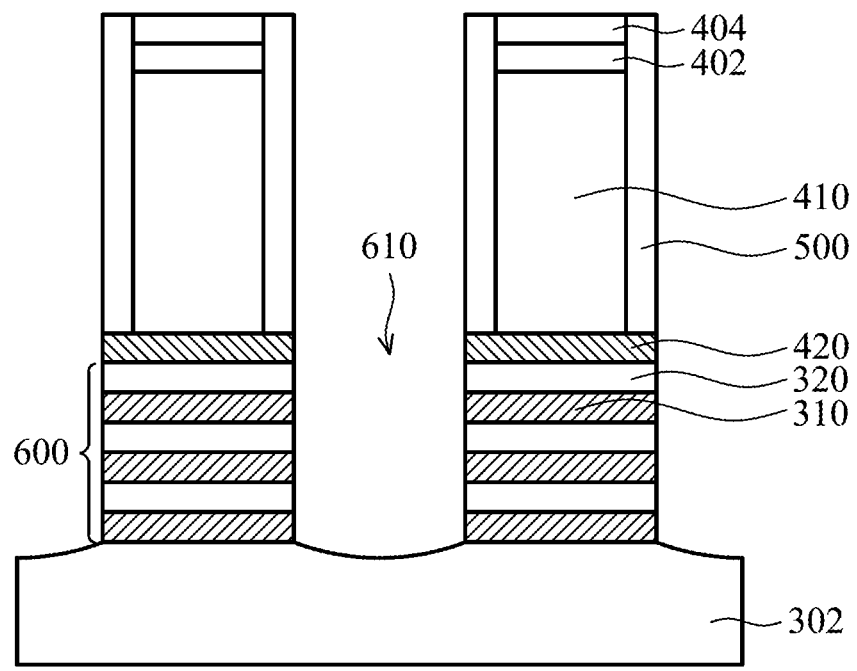

Corresponding to operation 208 of FIG. 2, FIG. 6 is a cross-sectional view of the nanostructure transistor device 200 where the first semiconductor layers 210 and the second semiconductor layers 220 are patterned into stacks 600 separated from each other by trenches 610. The portion of the sidewall spacer 500 and the portion of the etch stop layer 420 that is in the opening between adjacent dummy gates 410 is removed to expose an upper portion of the first semiconductor layers 310 and the second semiconductor layers 320. For example, an appropriate anisotropic etch may remove the portion of the sidewall spacer 500 and the portion of the etch stop layer 420 that is in the opening between adjacent dummy gates 410 using an appropriate dry etch with the dummy gates 410 as an etch mask. The etching of the sidewall spacer 500 and the etch stop layer 420 may be performed with a first etch for the sidewall spacer 500 and a second etch for the etch stop layer 420.

Once an upper portion of the first semiconductor layers 310 and the second semiconductor layers 320 are exposed in regions between the dummy gates 410, the first semiconductor layers 310 and the second semiconductor layers 320 are patterned by an etch to form stacks 600. For example, the reactive ion etch may be (RIE), neutral beam etch (NBE), the like, or combinations thereof. The etch may be anisotropic.

Figure 7:
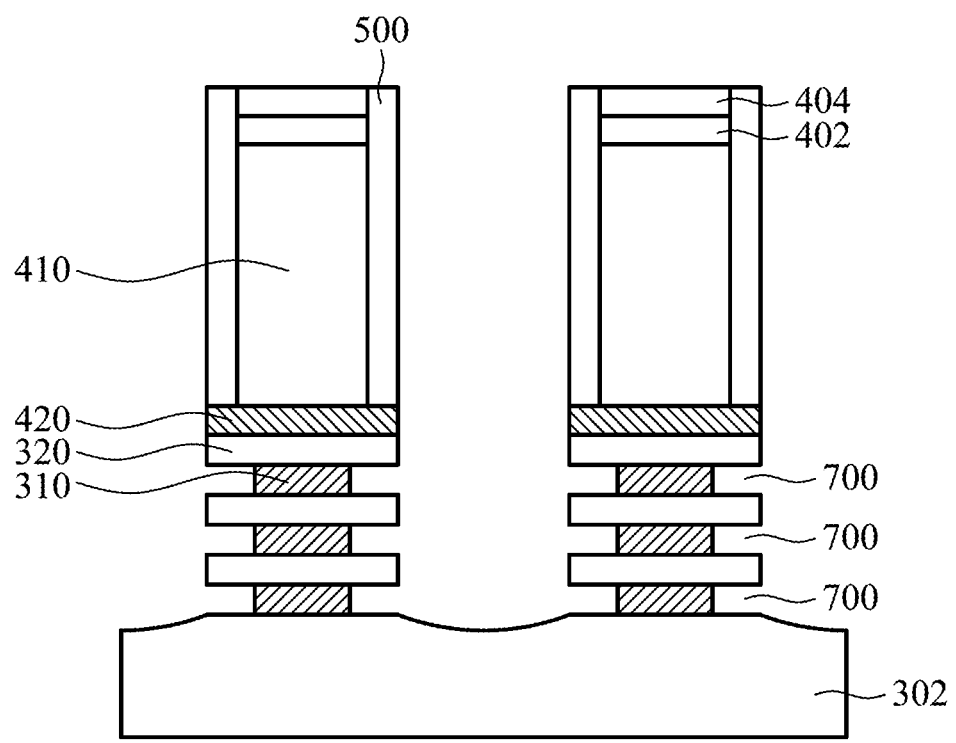
Figure 8:
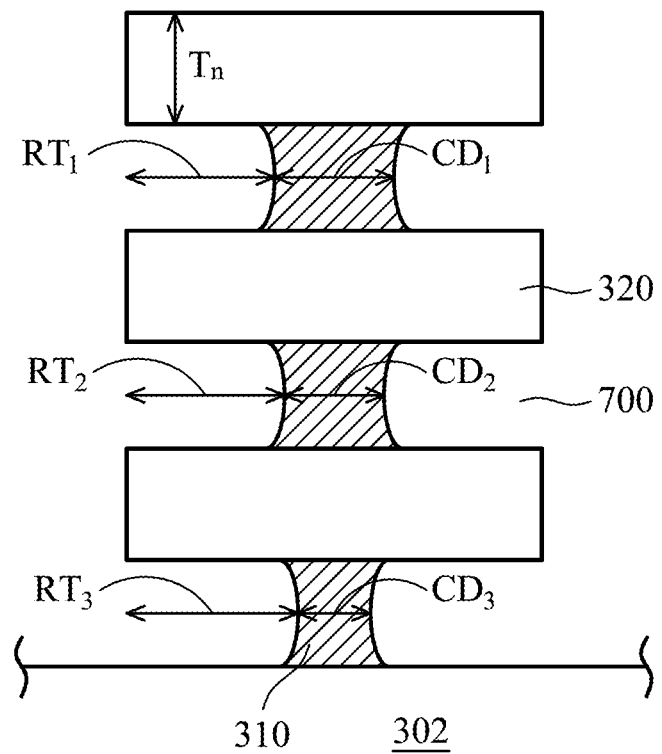

Corresponding to operation 210 of FIG. 2, FIG. 7 is a cross-sectional view of the nanostructure transistor device 300 where recesses 700 are formed in the sides of the first semiconductor layers 310. FIG. 8 is a magnified portion of FIG. 7 illustrating the portions of the device with the recesses 700. FIGS. 7 and 8 illustrate a three level structure of the first semiconductor layers 310, for example, where the disclosure is not limited to a three level structure. The three level structure of the first semiconductor layers 310 includes a top first semiconductor layer 310 (first semiconductor sub-layer), a middle first semiconductor layer 310 (second semiconductor sub-layer), and a bottom first semiconductor layer 310 (third semiconductor sub-layer).

The recesses 700 may be formed by an etch which provides a substantially uniform shape, and substantially uniform lateral depth to the recesses 700. The etch may be a dry isotropic etch which selectively etches the first semiconductor layers 310 over the second semiconductor layers 320, where the second semiconductor layers 320 may be slightly etched during the etch. End portions of the semiconductor layers 310 can be removed (e.g., etched) using a "pull-back" process to pull the semiconductor layers 310. It is understood that the pull-back distance (i.e., the extent to which each of the semiconductor layers 310 is etched, or pulled-back) can be arbitrarily increased or decreased. In an example where the semiconductor layers 320 include Si, and the semiconductor layers 310 include $Si_{1-x}Ge_x$, the pull-back process may include a reactant gas isotropic etch process, which etches SiGe without substantially attacking Si.

The first semiconductor layers 310 may be etched to form recesses 700 using an etching process to provide uniformity to the size and lateral depth of the recesses 700. The etch may be tuned to include etch conditions where the lateral edges of the first semiconductor layers 310 and the second semiconductor layers 320 are exposed to an etchant gas to selectively etch recesses 700 in the first semiconductor layers 310. The etching process may cause the size and/or lateral depth of the recesses 700 to be substantially uniform, according to some embodiments.

The etch conditions may be such that a reactant gas provides etching in a plasma-less environment, and thus a plasma environment is not needed in some embodiments. The plasma-less environment may be maintained throughout the etching of recesses 700 in the first semiconductor layers 310 in some embodiments.

According to some embodiments, the etch conditions may include a flow rate of a main reactant gas and of a dilution gas, wherein the ratio of the flow rate of the main reactant gas to the flow rate of the dilution gas is set to provide substantially uniform size and/or lateral depth of the recesses 700 throughout the levels of the first semiconductor layers 310. The main reactant gas is a reactant gas among the reactant gases with a greatest etch rate of the first semiconductor layers 310. For example, the ratio of the flow rate of the main reactant gas to the flow rate of the dilution gas may be less than or equal to a threshold value. The threshold value may be 1/50 for $Si_{1-x}Ge_x$. as the first semiconductor layers 310 and $F_2$ as the main reactant gas, for example.

According to some embodiments, the etch conditions may be characterized by an etch loading. The etch loading effect is an effect where the etching amount in a region depends on factors such as surface impurities, auto doping and the geometry effect. For example, for etching the recesses 700 in the first semiconductor layers 310, the loading can be expressed as the lateral depth of the recesses 700, where material of the semiconductor layers 310 has been removed.

Table I illustrates an example of an etch with HF and $F_2$ as the reactant gases, where $F_2$ is the main reactant gas, and the number of levels of the first semiconductor layers 310 is three, a top level (first semiconductor sub-layer), a middle level (second semiconductor sub-layer), and a bottom level (third semiconductor sub-layer). Etching was performed, under etch conditions 1, 2 and 3, to etch $Si_{1-x}Ge_x$. relative to Si, where only condition 3 provided a uniform size for the recesses 700. Columns 1, 2 and 3, correspond respectively to the flow rates in sccm of the dilution gas $N_2$, reactant gas HF, and main reactant gas $F_2$. Columns 4 and 5 correspond respectively to total pressure, and total flow rate. Columns 6 and 7 correspond respectively to the partial pressure of reactant gas HF, and main reactant gas $F_2$. Columns 8 and 9 correspond respectively to the etch loading difference expressed in lateral depth of the recesses in the bottom level and middle level, and the middle level and top level. The etch provides a different top to down etch loading for conditions 1 and 2. The values in columns 8 and 9 are exemplary for condition 3, and may have a range between 1.5 and 2.5 nm, for example.

While not being bound any theory, the uniformity of the recess depth in different levels is believed to be due in part to a relatively low ratio of the flow rate of the main reactant gas to the dilution gas. Further, the particular dilution gases, reactant gases, main reactant gas, and etch conditions such as flow rates, and partial pressures, are exemplary, and conditions other than those of condition 3 are contemplated.

The etch conditions, such as condition 3 from Table I, and as generally described in the disclosure, provide a manner of controlling the CD of the first semiconductor layers 310, and the subsequently formed inner spacers 1000 (see FIG. 10). Improved defect performance can be achieved due to uniform lateral thickness of the inner spacers 1000. Further, a wider window can be achieved for metal gate CD control

TABLE 1

| | SiGe recess etch conditions | | | | | | | | |
|---|---|---|---|---|---|---|---|---|---|
| Condition | Dilute N2 (sccm) | HF (sccm) | F2 (sccm) | Total (mT) | Total Flow (sccm) | HF PP | F2 PP | $1^{st}/2^{nd}$ loading (nm) | $2^{nd}/3^{rd}$ loading (nm) |
| 1 | 355 | 400 | 25 | 560 | 780 | 287.2 | 18.0 | 5.2 | 9.5 |
| 2 | 1275 | 400 | 25 | 560 | 1700 | 131.8 | 8.2 | 3.2 | 4.8 |
| 3 | 1275 | 230 | 23 | 480 | 1528 | 72.3 | 7.2 | 2.2 | 2.1 |

FIG. 8 illustrates a magnified illustration of the region where the recesses 700 are formed after the pull-back etch for the three level structure of FIG. 7 with a top level indicated by the subscript 1, a middle level indicated by the subscript 2, and a bottom level indicated by the subscript 3. The second semiconductor layers 320 have a thickness Th. The thickness Th may be in the range 3 to 10 nm, for example. The recesses 700 have a lateral recess depth of $RT_1$, $RT_2$ and $RT_3$, respectively for the top, middle and bottom levels. The lateral recess depth of $RT_1$, $RT_2$ and $RT_3$ may be in the range 3 to 10 nm, for example. The pulled-back first semiconductor layers 310 have a lateral thickness of $CD_1$, $CD_2$ and $CD_3$, respectively for the top, middle and bottom levels. The lateral thickness of $CD_1$, $CD_2$ and $CD_3$ may be in the range 5 to 20 nm, for example. The difference in etch loading, expressed as the lateral depth of the recesses, from the top to middle level may be less than 2 nm, and the difference in the etch loading from the middle to bottom level may be less than 2 nm, for example. Thus, the 2 nm indicates the lateral etched amount difference between respective adjacent levels after the etch.

Figure 9:
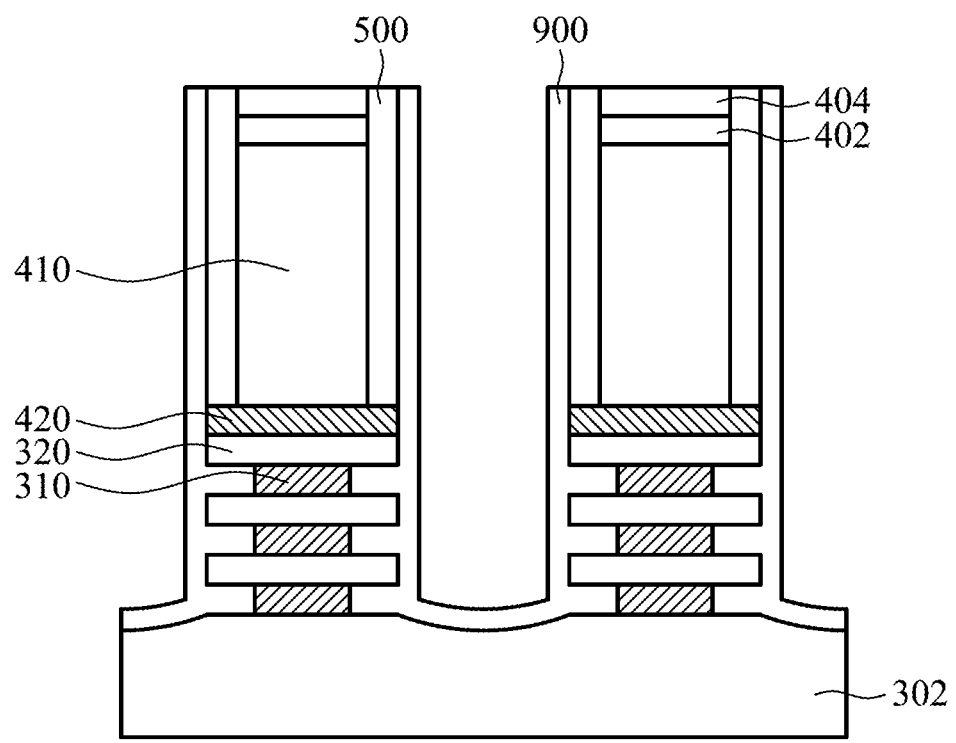

Corresponding to operation 212 of FIG. 2, FIG. 9 is a cross-sectional view of the nanostructure transistor device 300 where an inner spacer layer 900 is formed. The inner spacer layer 900 can be formed by conformal deposition by chemical vapor deposition (CVD), or by monolayer doping (MLD) of nitride followed by spacer RIE. The inner spacer layer 900 can be deposited using, e.g., a conformal deposition process. A material of the inner spacer layer 900 can be, for example, formed of silicon nitride, silicoboron carbonitride, silicon carbonitride, silicon carbon oxynitride, or any other type of dielectric material (e.g., a dielectric material having a dielectric constant less than about 5) appropriate to the role of forming an insulating gate sidewall spacers of transistors. The inner spacer layer 900 may be formed conformally to cover the side walls 500, sides of the trench 610 and to fill the recesses 700.

Figure 10:
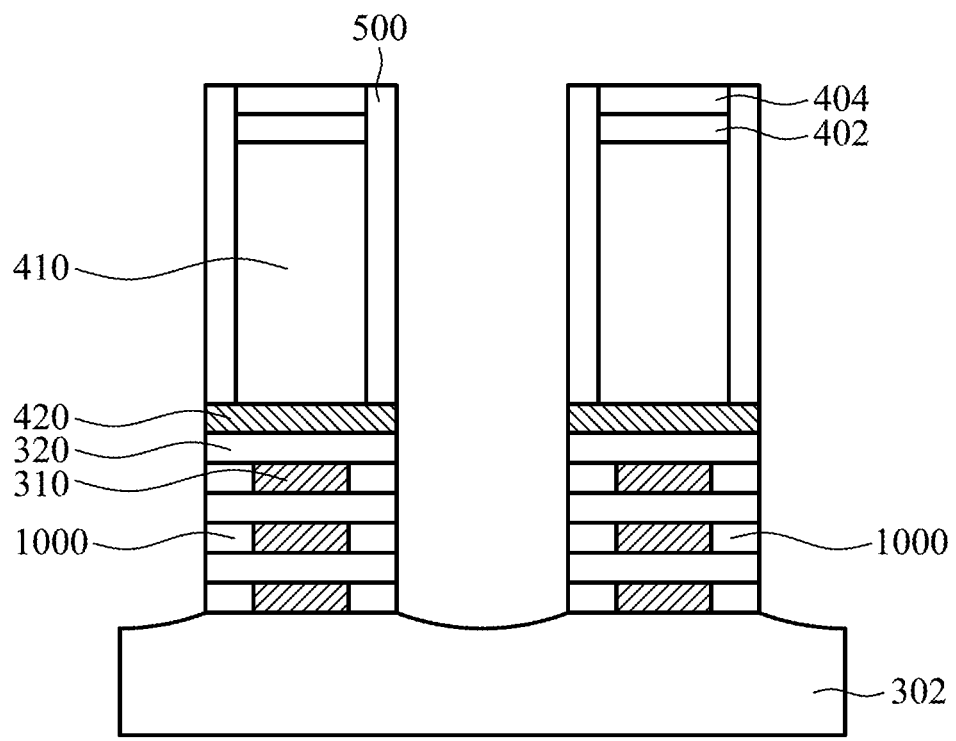

Corresponding to operation 214 of FIG. 2, FIG. 10 is a cross-sectional view of the nanostructure transistor device 300 where inner spacers 1000 are formed in the recesses and removed from other portions of the device. The inner spacers 1000 may be formed, for example, by a dry etch, or a wet etch to remove portions of the inner spacer layer 900 except for in the recesses 700. The particular etchant will depend on the material of the inner spacer layer 900.

Figure 11:
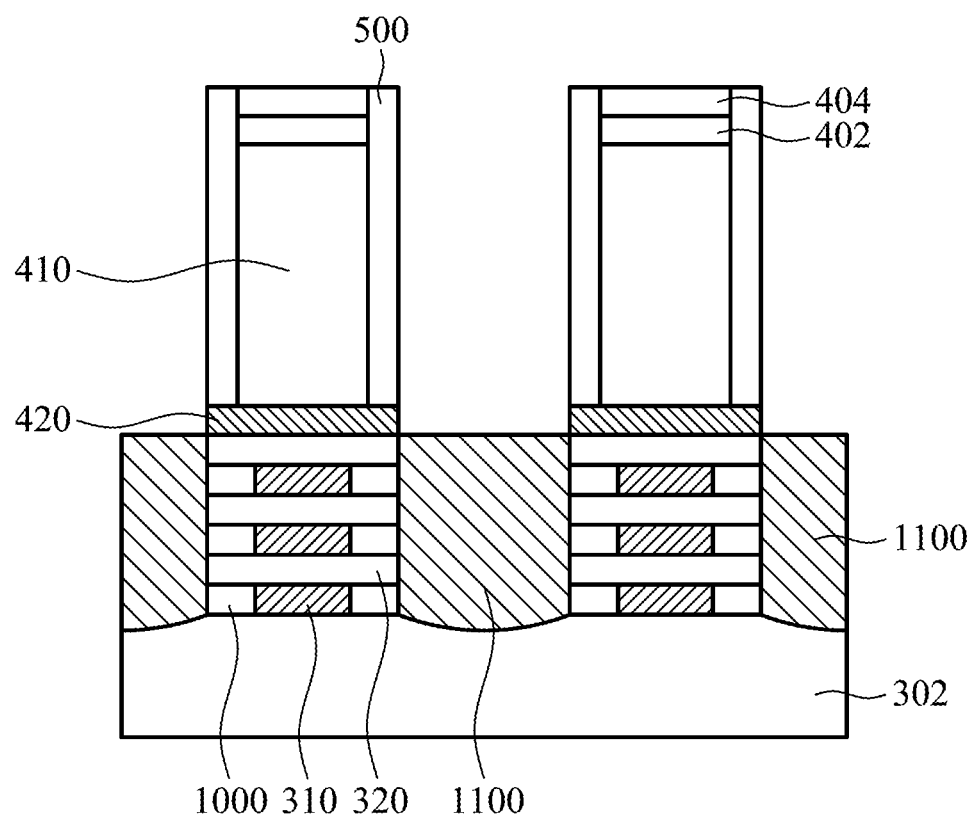

Corresponding to operation 216 of FIG. 2, FIG. 11 is a cross-sectional view of the nanostructure transistor device 300 with source/drain structures 1100 formed between the stacks 600. As shown in the illustrated example of FIG. 11, the source/drains 1100 are formed in the regions between the stacks 600. The source/drain structures 1100 are coupled to respective ends of the stacks 600 of each of the second semiconductor layers 320.

The source/drain structures 1100 may each include silicon germanium (SiGe), indium arsenide (InAs), indium gallium arsenide (InGaAs), indium antimonide (InSb), germanium arsenide (GaAs), germanium antimonide (GaSb), indium aluminum phosphide (InAlP), indium phosphide (InP), or combinations thereof. The source/drain structures 1100 may be formed using an epitaxial layer growth process on exposed ends of each of the semiconductor layers 320. For example, the growth process can include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epitaxial processes.

In-situ doping (ISD) may be applied to form doped source/drain structures 1100, thereby creating the junctions for the nanostructure transistor device 300. For example, when the nanostructure transistor device 300 is configured in n-type, the source/drain structures 1100 can be doped by implanting n-type dopants, e.g., arsenic (As), phosphorous (P), etc., into them. When the nanostructure transistor device 300 is configured in p-type, the source/drain structures 1100 can be doped by implanting p-type dopants, e.g., boron (B), etc., into them.

Figure 12:
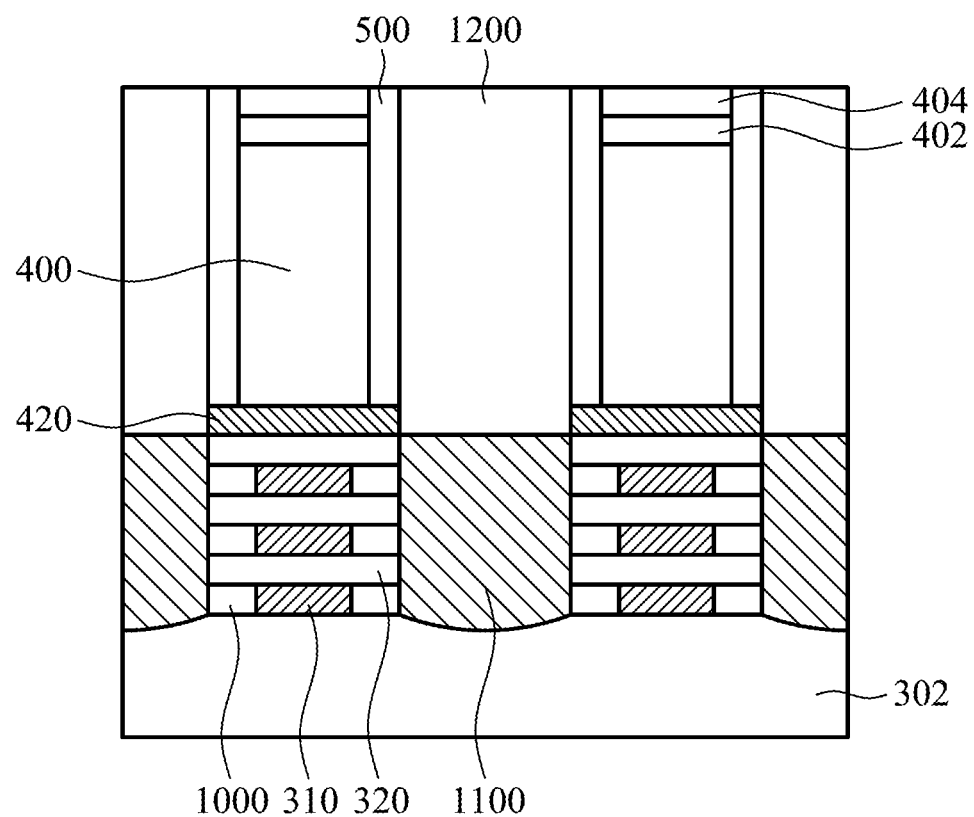

Corresponding to operation 218 of FIG. 2, FIG. 12 is a cross-sectional view of the nanostructure transistor device 300 including an inter-layer dielectric (ILD) 1200 at one of the various stages of fabrication. As shown in the illustrated example of FIG. 12, the ILD 1200 is formed on opposing sides of each of the dummy gates 410 to overlay the source/drain structures 1100.

In some embodiments, the ILD 1200 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. Next, a planarization process, such as a CMP process, may be performed to achieve a level top surface for the ILD 1200. After the planarization process, the top surface of the ILD 1200 is level with a top surface of the dummy gates 410, in some embodiments.

Figure 13:
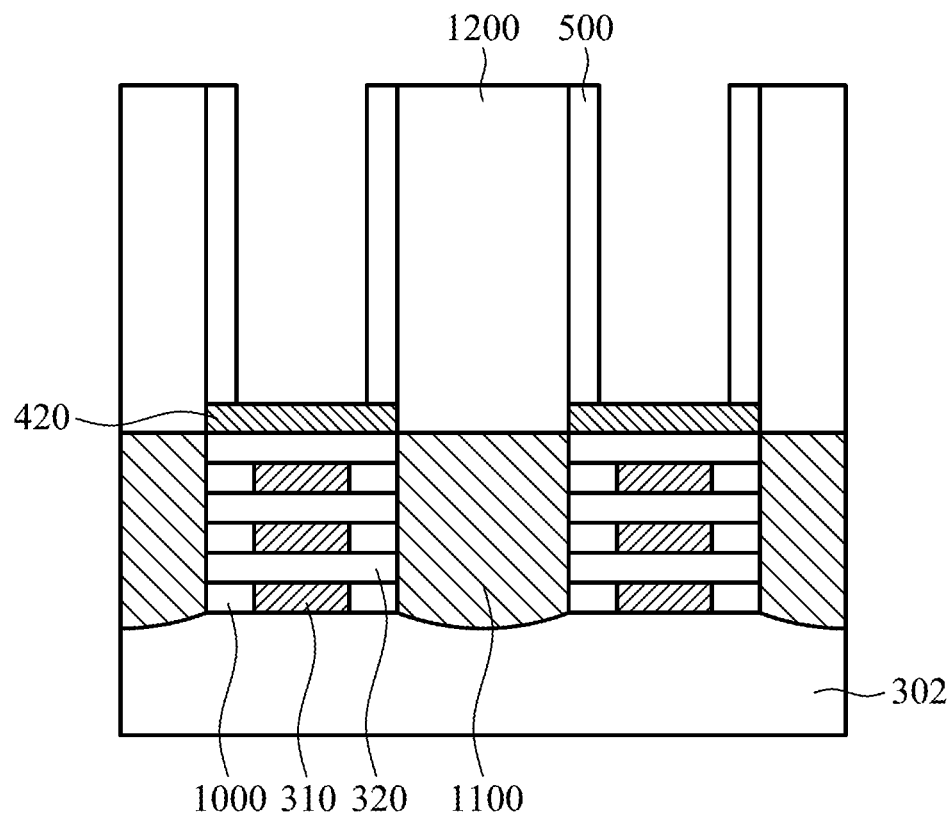

Corresponding to operation 220 of FIG. 2, FIG. 13 is a cross-sectional view of the nanostructure transistor device 300 including removing the dummy gates 410. Subsequently to forming the ILD 1200, the dummy gates 410, are removed. The dummy gates 410 can be removed by an etching process, e.g., RIE or chemical oxide removal (COR).

Figure 14:
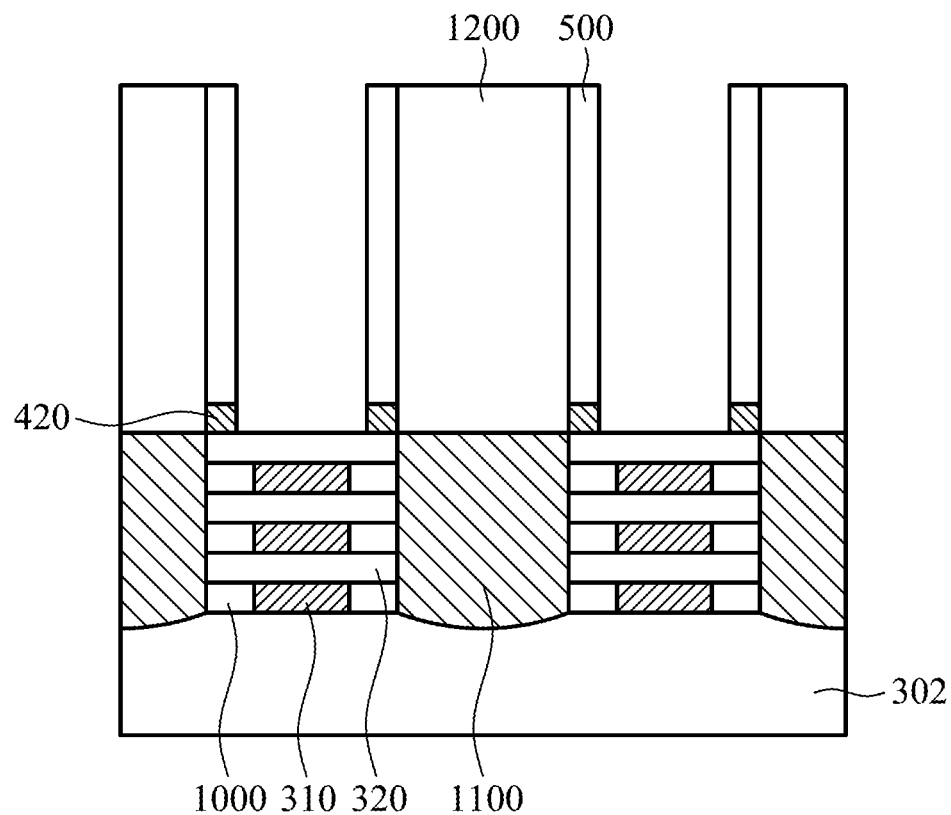

Corresponding to operation 222 of FIG. 2, FIG. 14 is a cross-sectional view of the nanostructure transistor device 300 including opening the remaining etch stop layer 420. The remaining etch stop layer 420 may be opened to expose the underlying first semiconductor layers 210. The etch stop layer 420 may be opened using an appropriate etch for the material of the etch stop layer 420, such as by an anisotropic dry etch or an isotropic wet etch, for example. While the remaining etch stop layer 420 may be opened to expose the underlying first semiconductor layers 310, the remaining etch stop layer 420 need not be removed.

Figure 15:
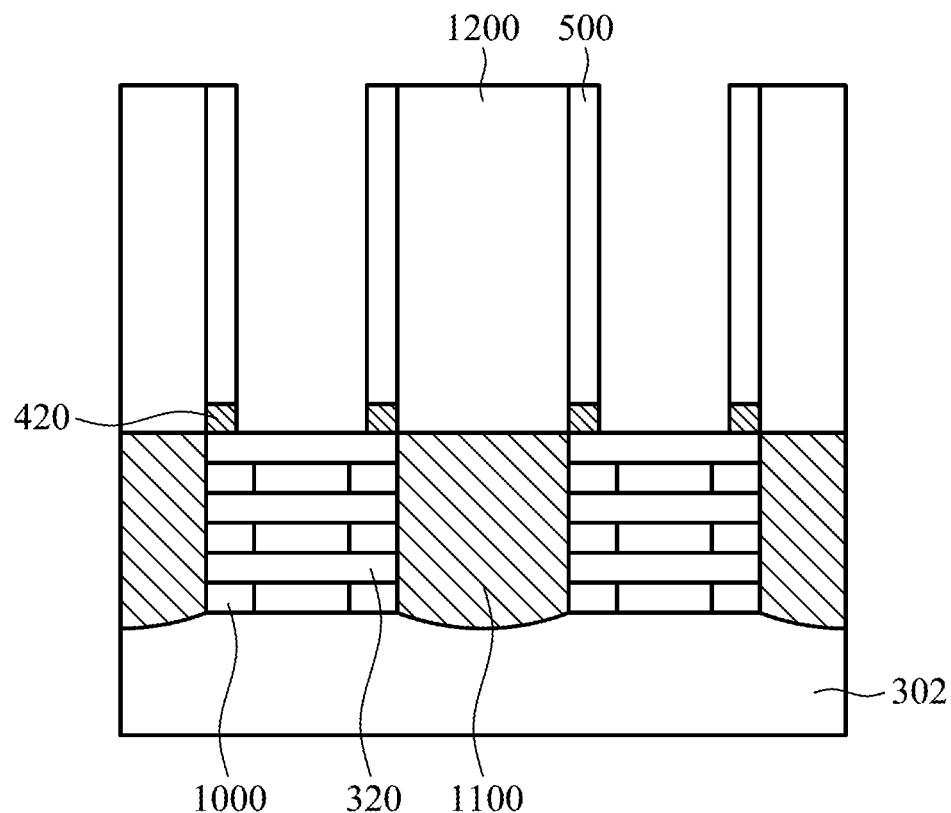

Corresponding to operation 224 of FIG. 2, FIG. 15 is a cross-sectional view of the nanostructure transistor device 300 including removing the first semiconductor layers 210 through the opened etch stop layer. Once the etch stop layer 420 has been opened, the underlying first semiconductor layers 310 may be removed through the opening. The first semiconductor layers 310 are removed by applying a selective etch (e.g., a hydrochloric acid (HCl)), while leaving the second semiconductor layers 320 substantially intact. After the removal of the first semiconductor layers 310, a respective bottom surface and top surface of each of the semiconductor layers 320 may be exposed.

Figure 16:
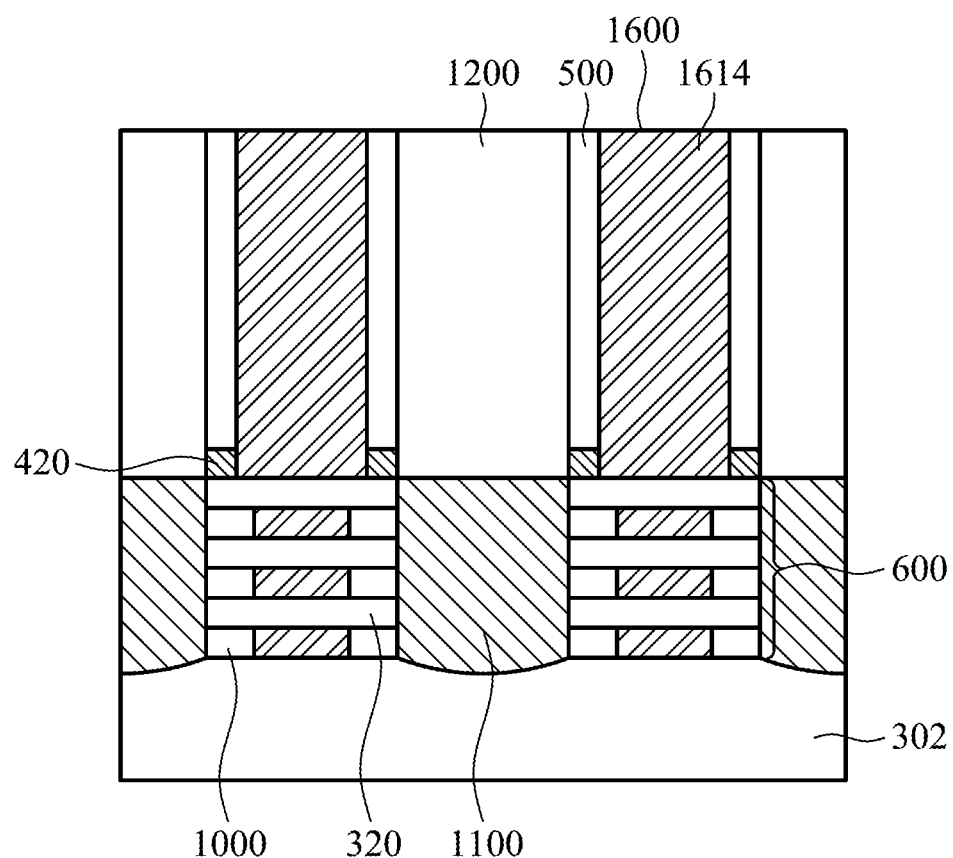

Corresponding to operation 226 of FIG. 2, FIG. 16 is a cross-sectional view of the nanostructure transistor device 300 including forming active gates. The active gates 1610 may be formed in the opening in the ILD 1200 and wrap around the second semiconductor layers 320. The active gates 1610 may include a gate dielectric (not shown for simplicity) and a gate metal 1614. The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer.

The gate metal 1614 can wrap around each of the second semiconductor layers 320 with the gate dielectric disposed therebetween. The gate metal 1614 may include a stack of multiple metal materials. For example, the gate metal 1614 may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

FIG. 16 illustrates three levels of the second semiconductor layers 320 for each stack 600, where each level of the second semiconductor layers 320 for a stack corresponds to a different channel. FIG. 16 further illustrates the number of levels of the inner spacer 1000 for a stack is also three. In general, the number of levels of the second semiconductor 320 (channels) and levels of inner spacer 1000 may be more or less than three for each stack 600. For example, the number of levels of the second semiconductor 320 (channels) and the number of levels of inner spacer 1000 may be between 1 and 10 for each stack 600. Further, the number of levels of inner spacer 1000 may be the same as, or one more than, the number of levels of the second semiconductor 320 for each stack 600.

In one aspect of the present disclosure, a method of fabricating a semiconductor device is disclosed. A substrate is provided. Alternating layers of first semiconductor layers and second semiconductor layers are formed. The first semiconductor layers are formed of a first semiconductor material, and the second semiconductor layers are formed of a second semiconductor material different from the first semiconductor material. The first semiconductor layers include a first semiconductor sub-layer and a second semiconductor sub-layer below the first semiconductor sub-layer. The alternating layers of the first semiconductor layers and the second semiconductor layers are patterned to form stacks of the alternating layers and to expose lateral edges of the alternating layers in the stacks. The lateral edges of the alternating layers in the stacks are exposed under etch conditions to an etchant to selectively etch recesses in the lateral edges of the first semiconductor sub-layer and the second semiconductor sub-layer such that a size of the recesses is substantially uniform. The etch conditions include exposing the lateral edges of the alternating layers in the stacks to a dilution gas and reaction gas under plasma-less conditions.

In another aspect of the present disclosure, a method of fabricating a semiconductor device is disclosed. A substrate is provided. Alternating layers of first semiconductor layers and second semiconductor layers are formed. The first semiconductor layers are formed of a first semiconductor material, and the second semiconductor layers are formed of a second semiconductor material different from the first semiconductor material. The first semiconductor layers include a first semiconductor sub-layer and a second semiconductor sub-layer below the first semiconductor sub-layer. The alternating layers of the first semiconductor layers and the second semiconductor layers are patterned to form stacks of the alternating layers and to expose lateral edges of the alternating layers in the stacks. The lateral edges of the alternating layers in the stacks are exposed under etch conditions to an etchant to selectively etch recesses in the lateral edges of the first semiconductor sub-layer and the second semiconductor sub-layer. The etch conditions include exposing the lateral edges of the alternating layers in the stacks to a dilution gas and reaction gas under plasma-less conditions.

In another aspect of the present disclosure, a method of fabricating a semiconductor device is disclosed. substrate is provided. Alternating layers of first semiconductor layers and second semiconductor layers are formed. The first semiconductor layers are formed of a first semiconductor material, and the second semiconductor layers are formed of a second semiconductor material different from the first semiconductor material. The first semiconductor layers include a first semiconductor sub-layer and a second semiconductor sub-layer below the first semiconductor sub-layer. The alternating layers of the first semiconductor layers and the second semiconductor layers are patterned to form stacks of the alternating layers and to expose lateral edges of the alternating layers in the stacks. The lateral edges of the alternating layers in the stacks are exposed under etch conditions to an etchant to selectively etch recesses in the lateral edges of the first semiconductor sub-layer and the second semiconductor sub-layer, wherein the etch conditions include exposing the lateral edges of the alternating layers in the stacks to a dilution gas and reaction gas, the reaction gas including a main reaction gas which has a greatest etch rate, among the gases of the reaction gas, of the first semiconductor layers, wherein a ratio of a flow rate of the main reaction gas to a flow rate of the dilution gas is less than or equal to a threshold value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    providing a substrate;
    forming alternating layers of first semiconductor layers and second semiconductor layers, the first semiconductor layers formed of a first semiconductor material, the second semiconductor layers formed of a second semiconductor material different from the first semiconductor material, the first semiconductor layers including a first semiconductor sub-layer, a second semiconductor sub-layer below the first semiconductor sub-layer, and a third semiconductor sub-layer below the second semiconductor sub-layer;
    patterning the alternating layers of the first semiconductor layers and the second semiconductor layers to form stacks of the alternating layers and to expose lateral edges of the alternating layers in the stacks;
    exposing, under etch conditions, the lateral edges of the alternating layers in the stacks to an etchant to selectively etch recesses in the lateral edges of the first semiconductor sub-layer, the second semiconductor sub-layer, and the third semiconductor sub-layer, such that a size of the recesses is substantially uniform, wherein the etch conditions include exposing the lateral edges of the alternating layers in the stacks to a dilution gas and reaction gas under plasma-less conditions, and such that a first lateral depth of the first semiconductor sub-layer is greater than a second lateral depth of the second semiconductor sub-layer, and the second lateral depth of the second semiconductor sub-layer is greater than a third lateral depth of the third semiconductor sub-layer.

2. The method of fabricating a semiconductor device according to claim 1,
    wherein the first semiconductor material includes $Si_{1-x}Ge_x$.

3. The method of fabricating a semiconductor device according to claim 2,
    wherein x is less than 0.5 in molar ratio.

4. The method of fabricating a semiconductor device according to claim 1,
    wherein a difference in the lateral depth of the recess in the first semiconductor sub-layer and the lateral depth of the recess in the second semiconductor sub-layer is less than or equal to 2 nm and greater than 0 nm.

5. The method of fabricating a semiconductor device according to claim 1, wherein the reaction gas includes at least one of HF or $F_2$.

6. The method of fabricating a semiconductor device according to claim 1, wherein the dilution gas includes at least nitrogen.

7. The method of fabricating a semiconductor device according to claim 1, further comprising forming an inner spacer layer in the recesses, and
removing portions of the inner spacer layer leaving inner spacers in the recesses.

8. The method of fabricating a semiconductor device according to claim 7, further comprising:
forming source/drain regions epitaxially from the lateral edges of the second semiconductor layers, the source/drain regions covering the inner spacers.

9. The method of fabricating a semiconductor device according to claim 8, further comprising:
removing the inner spacers from the recesses; and
removing the first semiconductor layers through the recesses.

10. A method of fabricating a semiconductor device, comprising:
providing a substrate;
forming alternating layers of first semiconductor layers and second semiconductor layers, the first semiconductor layers formed of a first semiconductor material, the second semiconductor layers formed of a second semiconductor material different from the first semiconductor material, the first semiconductor layers including a first semiconductor sub-layer, a second semiconductor sub-layer below the first semiconductor sub-layer, and a third semiconductor sub-layer below the second semiconductor sub-layer;
patterning the alternating layers of the first semiconductor layers and the second semiconductor layers to form stacks of the alternating layers and to expose lateral edges of the alternating layers in the stacks;
exposing, under etch conditions, the lateral edges of the alternating layers in the stacks to an etchant to selectively etch recesses in the lateral edges of the first semiconductor sub-layer, the second semiconductor sub-layer, and the third semiconductor sub-layer, wherein the etch conditions include exposing the lateral edges of the alternating layers in the stacks to a dilution gas and reaction gas under plasma-less conditions such that a first lateral depth of the first semiconductor sub-layer is greater than a second lateral depth of the second semiconductor sub-layer, and the second lateral depth of the second semiconductor sub-layer is greater than a third lateral depth of the third semiconductor sub-layer.

11. The method of fabricating a semiconductor device according to claim 10,
wherein the first semiconductor material includes $Si_{1-x}Ge_x$.

12. The method of fabricating a semiconductor device according to claim 11,
wherein x is less than 0.5 in molar ratio.

13. The method of fabricating a semiconductor device according to claim 10, wherein the reaction gas includes at least one of HF or $F_2$.

14. A method of fabricating a semiconductor device, comprising:
providing a substrate;
forming alternating layers of first semiconductor layers and second semiconductor layers, the first semiconductor layers formed of a first semiconductor material, the second semiconductor layers formed of a second semiconductor material different from the first semiconductor material, the first semiconductor layers including a first semiconductor sub-layer, a second semiconductor sub-layer below the first semiconductor sub-layer, and a third semiconductor sub-layer below the second semiconductor sub-layer;
patterning the alternating layers of the first semiconductor layers and the second semiconductor layers to form stacks of the alternating layers and to expose lateral edges of the alternating layers in the stacks;
exposing, under etch conditions, the lateral edges of the alternating layers in the stacks to an etchant to selectively etch recesses in the lateral edges of the first semiconductor sub-layer, the second semiconductor sub-layer, and the third semiconductor sub-layer, wherein the etch conditions include exposing the lateral edges of the alternating layers in the stacks to a dilution gas and reaction gas, the reaction gas including a main reaction gas which has a greatest etch rate, among the gases of the reaction gas, of the first semiconductor layers, wherein a ratio of a flow rate of the main reaction gas to a flow rate of the dilution gas is less than or equal to a threshold value such that a first lateral depth of the first semiconductor sub-layer is greater than a second lateral depth of the second semiconductor sub-layer, and the second lateral depth of the second semiconductor sub-layer is greater than a third lateral depth of the third semiconductor sub-layer.

15. The method of fabricating a semiconductor device according to claim 14, wherein a size of the recesses of the first semiconductor sub-layer and the second semiconductor sub-layer are substantially uniform to each other.

16. The method of fabricating a semiconductor device according to claim 14,
wherein the first semiconductor material includes $Si_{1-x}Ge_x$, x is less than 0.5 in molar ratio, and the main reaction gas is $F_2$.

17. The method of fabricating a semiconductor device according to claim 16,
wherein the threshold value is 1/50.

18. The method of fabricating a semiconductor device according to claim 16, wherein the reaction gas includes HF.

19. The method of fabricating a semiconductor device according to claim 14, wherein the first semiconductor material includes $Si_{1-x}Ge_x$.

20. The method of fabricating a semiconductor device according to claim 19, wherein x is less than 0.5 in molar ratio.

* * * * *